United States Patent
Klopfenstein et al.

(10) Patent No.: US 9,664,534 B2
(45) Date of Patent: May 30, 2017

(54) ELECTROMECHANICAL APPARATUS COMPRISING A CAPACITIVE DEVICE FOR DETECTION OF THE ANGULAR POSITION OF A WHEEL SET, AND METHOD FOR DETECTION OF THE ANGULAR POSITION OF A WHEEL SET

(71) Applicant: ETA SA Manufacture Horlogere Suisse, Grenchen (CH)

(72) Inventors: Francois Klopfenstein, Delemont (CH); Pascal Lagorgette, Bienne (CH); Damien Schmutz, La Neuveville (CH); Raphael Haenni, Sion (CH); Matthieu Tardivon, Renens (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 14/978,452

(22) Filed: Dec. 22, 2015

(65) Prior Publication Data

US 2016/0178402 A1 Jun. 23, 2016

(30) Foreign Application Priority Data

Dec. 23, 2014 (EP) .................................... 14200171

(51) Int. Cl.
*G04C 3/14* (2006.01)
*G04C 3/00* (2006.01)
(Continued)

(52) U.S. Cl.
CPC .............. *G01D 5/24* (2013.01); *G01D 5/241* (2013.01); *G01D 5/2412* (2013.01); *G04C 3/002* (2013.01);
(Continued)

(58) Field of Classification Search
CPC . G04C 9/00; G04C 3/14; G04C 3/146; G04G 5/00; G04F 10/10; G01D 5/24; G01R 27/26
See application file for complete search history.

(56) References Cited

U.S. PATENT DOCUMENTS 3,732,553 A * 5/1973 Hardway, Jr. ........ G01D 5/2412
340/870.37
4,864,295 A * 9/1989 Rohr .................... G01D 5/2412
324/663
(Continued)

FOREIGN PATENT DOCUMENTS

JP 2004-163128 6/2004
JP 2004-233132 8/2004

OTHER PUBLICATIONS

European Search Report issued Aug. 12, 2015 in European Application 14200171, filed on Dec. 23, 2014 ( with English Translation).
(Continued)

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

Electromechanical apparatus including a wheel set and an analogue indicator member which are integral in rotation, a stepping motor, and a capacitive device for detection of the angular position of the wheel set, including a rotor, a stator and an electronic measuring circuit, the stator including a first pair of electrodes having a first capacitance and a second pair of electrodes having a second capacitance, the rotor being adapted such that the values of the two capacitances depend on the angular position of the rotor, and an electronic measuring circuit being provided for generating
(Continued)

an output signal representative of a difference between the respective values of the first and of the second capacitance.

19 Claims, 5 Drawing Sheets

(51) Int. Cl.
 *G01D 5/24* (2006.01)
 *G01D 5/241* (2006.01)
 *G04F 10/10* (2006.01)
 *G01R 27/26* (2006.01)

(52) U.S. Cl.
 CPC .............. *G04C 3/14* (2013.01); *G04C 3/146* (2013.01); *G04F 10/10* (2013.01); *G01R 27/26* (2013.01)

(56) References Cited

U.S. PATENT DOCUMENTS

| | | | |
|---|---|---|---|
| 5,293,356 A * | 3/1994 | Chin-Hsing | G04C 3/14 368/272 |
| 5,598,153 A * | 1/1997 | Brasseur | G01B 7/30 318/662 |
| 6,118,283 A * | 9/2000 | Cripe | G01B 7/30 324/660 |
| 6,252,825 B1 * | 6/2001 | Perotto | G04C 3/007 368/185 |
| 6,307,814 B1 | 10/2001 | Farine et al. | |
| 6,330,207 B1 * | 12/2001 | Born | G01B 7/30 368/181 |
| 6,454,458 B1 * | 9/2002 | Born | G04C 3/14 368/185 |
| 2002/0060953 A1 * | 5/2002 | Farine | G04C 3/14 368/69 |
| 2005/0002277 A1 * | 1/2005 | Fukuda | G01D 5/2412 368/80 |
| 2012/0229150 A1 * | 9/2012 | Inai | G06F 3/044 324/658 |

OTHER PUBLICATIONS

Philippe Vez et al. "Systeme de detection et de synchronization des aiguilles d'une montre", Horlogerie et Automobile Label mexanique, 2007, 3 pages.

\* cited by examiner

ELECTROMECHANICAL APPARATUS COMPRISING A CAPACITIVE DEVICE FOR DETECTION OF THE ANGULAR POSITION OF A WHEEL SET, AND METHOD FOR DETECTION OF THE ANGULAR POSITION OF A WHEEL SET

This application claims priority from European Patent application No. 14200171.8 filed Dec. 23, 2014, the entire disclosure of which is hereby incorporated herein by reference.

FIELD OF THE INVENTION

The present invention concerns firstly an electromechanical apparatus comprising a rotating wheel set, a stepping motor, an electronic control circuit arranged to control the stepping motor, a drive train connecting the stepping motor to the wheel set, and a capacitive detection device, the drive train having a ratio such that the stepping motor causes the wheel set to make exactly one complete revolution in a determined integer number of motor steps, so that the steps subdivide the complete revolution of the wheel set into said integer number of angular positions which are equidistant from each other, and the capacitive detection device comprising a rotor integral in rotation with the wheel set, a stator, and an electronic measuring circuit, the stator comprising a pair of electrodes having a capacitance, the rotor being adapted such that the capacitance value depends on the angular position of the rotor, and the electronic measuring circuit being arranged to generate and to provide to the electronic control circuit a signal dependent on the capacitance value. The present invention secondly concerns a method for determining the angular position of a wheel set forming part of an electromechanical apparatus comprising a capacitive detection device and which conforms to the above definition.

PRIOR ART

Electromechanical apparatuses satisfying the above definition are already known. Examples of such electromechanical apparatuses are found in electronic timepieces with an analogue display. Some of these timepieces comprise a digital internal timekeeper in addition to the hands rotating above the dial. This internal timekeeper is clocked by the same electrical impulses that control the advance of the hands. In these conditions, in principle, the hands and the timekeeper advance in a synchronous manner. It is known, in particular, to use such an internal timekeeper in multi-function watches where the same hands are provided for indicating the time or alternatively a second piece of information, such as, for example, an alarm time. Indeed, an internal timekeeper is necessary if one wishes to be able to continue to count the time that elapses while the hands are occupied with the display of the second piece of information. When the hands then return to their time display function, the information contained in the internal timekeeper allows the hands to return to the correct time.

However, in order for an application such as that just described to provide satisfaction, it is necessary to prevent the appearance of any difference between the time displayed by the watch hands and the time given by the internal timekeeper. It is known that such a difference may occur, for example, if the watch experiences a shock or due to electromagnetic or even mechanical interference (dust in the gear train for example). As a result of such interference, the motors of some timepieces lose steps. Any quartz analogue timepiece is therefore likely to exhibit a difference between the counting of control impulses and the angular position of the hands. If this difference is not corrected in time, it may increase to the point that it results in totally erroneous indications.

Moreover, in multi-function timepieces, the hands must be able to move not only forwards, but also backwards, according to variations in the quantity to be indicated. Further, the hands of a multi-function timepiece must be capable of changing position quickly forwards or backwards, on a change of function. To meet these constraints, multi-function timepiece hands are generally each driven by their own motor. Consequently, instead of the single internal timekeeper described above, multi-function timepieces usually include an up and down counter circuit for the control impulses of the motor of each hand. It will also be understood that the motors of a multi-function timepiece must bear significantly greater stress. In such conditions, the risk of a difference, or in other words desynchronization of the hands, is also considerably higher for a multi-function timepiece than for another timepiece.

Figure 8:
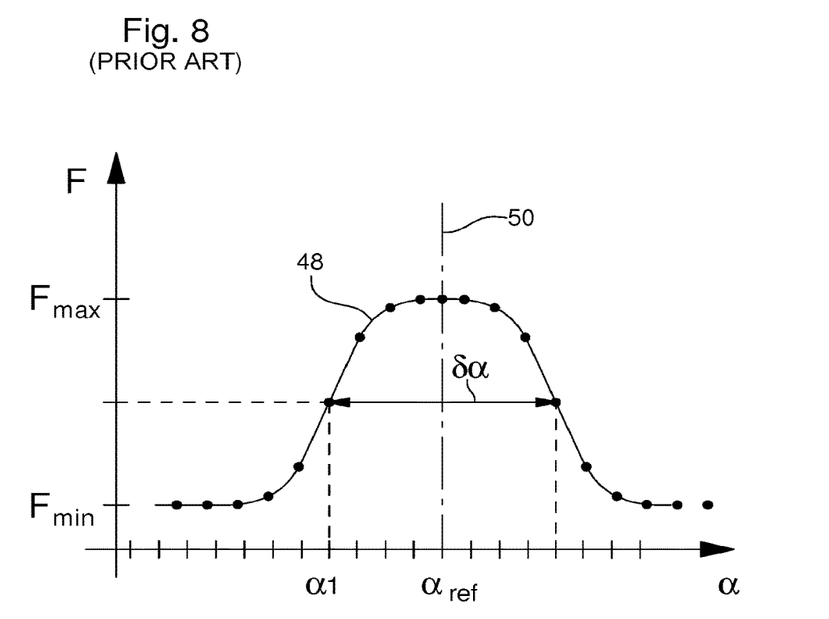
FIG. 8 is a copy of FIG. 6 of EP Patent No 0952426A1 of the prior art.

To over the problems that have just been described, it is known to supplement the simple counting/countdown of motor control impulses with detection of the actual position of the hands. EP Patent No 0952426, in particular, describes a timepiece that includes a timepiece movement provided with an analogue display and including a wheel integral in rotation with one of the hands. This wheel is formed of a plate that has at least one opening located in the intermediate region between the axis of rotation and the circumference. The timepiece further includes a device for detection of the angular position of this wheel. This device includes an inductive or capacitive sensor, arranged such that it is located directly underneath the opening in the plate when the wheel occupies a reference angular position. This sensor is sensitive to the variation in the quantity of metal in immediate proximity. The frequency or amplitude of the signal detected by the sensor, depending on whether it is an inductive or capacitive sensor, thus varies according to whether it is opposite a solid segment, or, conversely, the opening in the wheel plate, so that the frequency or amplitude of the detected signal reaches an extreme value (which may be a maximum or a minimum) when the plate opening passes directly opposite the sensor. The device further includes a memory for storing the signal frequency or amplitude after each step. FIG. 8 annexed hereto, which is labelled "Prior Art" corresponds to FIG. 6 of EP Patent No 0952426. It is a frequency graph of the signal detected by an inductive sensor during the step-by-step advance of the wheel. The aforementioned prior art document teaches that, in order to determine the angular position of the wheel from information featured on this graph, it is necessary to set a reference angular position. This reference position may be the position in which the plate opening is directly opposite the sensor, so that the reference position corresponds to a peak on the graph. The timepiece comprises electronic means which are arranged to identify the point on the graph that corresponds to the reference angular position, for example by calculating the midpoint at half peak height in FIG. 8. A specific angular difference $\delta\alpha$ between the two determined half-height points must make it possible to differentiate a particular angular sector and to deduce therefrom a reference angular position. Once the reference angular position is identified on the graph, it is easy to know the angle corresponding to each of the other points on the graph simply by counting the number of constant angular steps that separate the point on the graph concerned from this reference angular position.

The prior solution that has just been described has some drawbacks. In particular, the use of an inductive sensor may prove too expensive in terms of energy. Moreover, capacitive sensors have the drawback of being particularly sensitive to the environment and to disturbances caused by manufacturing and assembly tolerances. Further, as seen above, the angular position detection method disclosed in the aforementioned Patent document is based on the identification of a reference angular position associated with an extreme detected signal value; however, one drawback of capacitive sensors is that the shake of the wheel whose angular position requires detection may sometimes have a greater effect on the signal than the variation caused by the passage of the opening above the sensor. In such conditions, the detection method disclosed in EP Patent No 0952426 is likely to be unreliable. Thus, in order to distinguish the real signal from the disturbances, the aforementioned prior document also proposes selecting as the reference angular position a position on either side of which the signal shape, in the absence of disturbance, obeys certain assumptions of symmetry. It will be understood, however, that such assumptions regarding signal shape involve strict constraints as to the shape of the wheel plate opening and/or the geometry of the sensor electrodes.

BRIEF SUMMARY OF THE INVENTION

It is an object of the present invention to overcome the problems of the prior art that have just been described. The present invention achieves this object by providing, on the one hand, an electromechanical apparatus conforming to claim 1 annexed hereto, and on the other hand, a method for detection of the angular position of a wheel set of said electromechanical apparatus, which conforms to claim 12 annexed hereto.

It will be understood that the term "rotor" is used here to designate the rotating part of an electromechanical device (in this case the capacitive detection device) which interacts electrically or magnetically with a fixed part of the device called the "stator".

According to the invention, the stator comprises a first pair of electrodes having a first capacitance that varies with the angular position of the rotor and a second pair of electrodes having a second capacitance that varies with the angular position of the rotor. Further, the signal provided by the electronic measuring circuit is representative of a difference between the respective values of the first and second capacitances. It will therefore be understood that, due to the use of a differential measurement, particularly for first and second isometric capacitances, i.e. with equal standard values for an identical rotor effect, the capacitive detection device is capable of neutralising most of the disturbing effects related to the environment and to manufacturing and assembly tolerances. In particular, the differential measurement can neutralise almost all disturbances relating to the shake of the rotor.

According to the invention, the sequence of steps of the stepping motor determines an integer number of distinct angular positions that can be occupied by the wheel set whose position is required to be known. The angular position of the wheel set can thus be considered as a discrete variable. Further, the generated signal amplitude provided at output by the electronic measuring circuit can be considered as a function of this discrete variable. Further, due to the existence of the aforementioned disturbing effects, the signal amplitude provided by the electronic measuring circuit during two successive passages of the wheel set through the same angular position may change. It will therefore be understood that, although the angular positions occupied by the wheel set on each revolution are always the same, the signal amplitude that is actually provided by the electronic measuring circuit cannot be considered as a periodic function of angular position.

According to the invention, a table stored in the electronic control circuit can match a plurality of distinct angular positions of the wheel set to reference values of the output signal. These signal values which are stored are called reference values because they are values deduced from measurements made during an initial calibration operation and which can be considered as values corresponding to the signal amplitude provided by the electronic measuring circuit in the absence of any disturbing effects. Unlike the actual signal amplitude, which may vary from one measurement to another, the signal reference values define a periodic function, and it will be understood that the function period length is equal to the number of motor steps necessary to cause the wheel set to make one complete revolution. Further, as the function is periodic, each different angular position that the wheel set can occupy is associated with a distinct phase of the periodic function.

One of the steps of the method of the invention includes the operation consisting in calculating as many correlations as there are possible angular positions of the wheel set. Each correlation is calculated between, on the one hand, the succession of output signal values actually measured over one revolution, and on the other hand, the succession of signal reference values over one complete revolution, the starting point of said revolution being different for each correlation calculation, and this starting point being selected from among the possible angular positions of the wheel set. It will be understood that, in the case where the possible angular positions of the wheel set are all angular positions that are equidistant from each other defined by the motor steps, the successions of signal reference values over one complete revolution are formed by all the circular permutations of the sequence of reference values within an interval lasting one entire signal period. A subsequent step of the method of the invention consists in determining the angular position of the rotor by identifying, among all the calculated correlations, the correlation whose absolute value is the highest. It will be understood from the foregoing that the method of the invention makes it possible to detect the angular position of the rotor without first having to identify a reference angular position of the rotor.

BRIEF DESCRIPTION OF THE DRAWINGS

Other features and advantages of the invention will appear upon reading the following description, given solely by way of non-limiting example, with reference to the annexed drawings, in which.

DETAILED DESCRIPTION OF ONE EMBODIMENT

Figure 1:
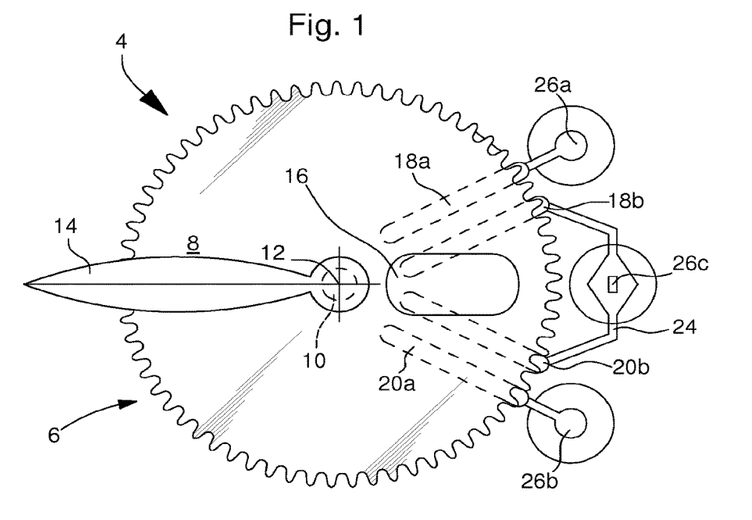
FIG. 1 is a partial plan top view showing the capacitive detection device of an electromechanical apparatus according to a first particular embodiment of the invention, the capacitive detection device comprising a rotor formed by a toothed wheel and a stator comprising two pairs of electrodes.
Figure 2:
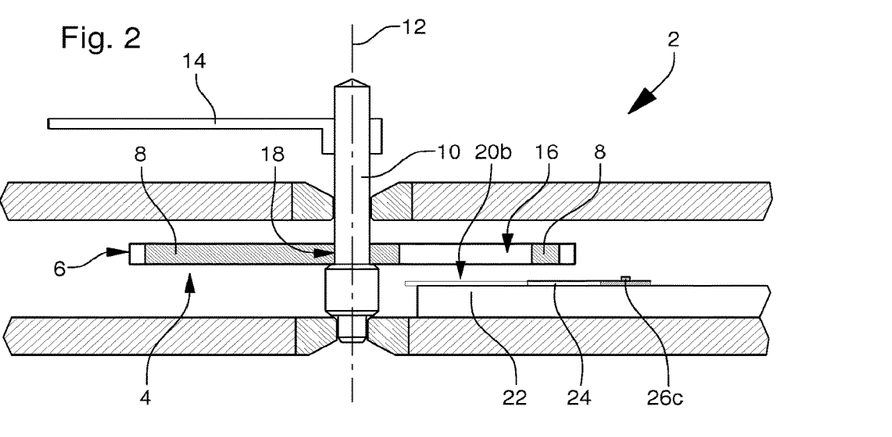
FIG. 2 is a partial sectional view of the electromechanical apparatus of FIG. 1 showing the capacitive detection device.

FIGS. 1 and 2 are partial, respectively top plan and sectional views of a quartz timepiece movement corresponding to a particular embodiment of the electromechanical apparatus of the invention. According to the invention, the timepiece movement comprises a rotating wheel set, a stepping motor, a drive train connecting the stepping motor to the wheel set, an electronic control circuit arranged to control the stepping motor, and a capacitive detection device. According to an advantageous variant of the invention, the electronic control circuit comprises in particular a circuit for counting the control impulses of the stepping motor.

It will be understood that FIGS. 1 and 2, which are partial views, more particularly illustrate the capacitive detection device (generally referenced 2) and the rotating wheel set which is formed by a toothed wheel 4, integral with an arbor 10. Referring more particularly to FIG. 1, it is seen that toothed wheel 4 comprises a plate 8 and a toothing 6 surrounding the plate. It is also seen that plate 8 is pierced with an opening 16. Wheel 4 is integral with arbor 10 which defines a geometric axis of rotation 12 The Figures also show an analogue indicator member 14, taking the form here of a hand, of an analogue display associated with the rotating wheel set. The hand is fixedly mounted on arbor 10. In the illustrated example, the hand could be used to indicate the hour, the minute, the second or any other information capable of being indicated by a timepiece. It will be understood that the hand may have any angular offset relative to opening 16. However, unlike the illustration of FIG. 1, the hand preferably points in the direction of the centre of opening 16 so that the unbalance caused by the presence of the opening can at least partially compensate for the torque caused by the weight of the hand. According to an alternative non-illustrated embodiment, analogue indicator member 14 could consist of another rotating display element, such as a disc provided with a cursor moving in an annular shaped window arranged in a dial.

The stepping motor (not shown) may for example be a bipolar "Lavet" type motor. The gear train (not shown) is preferably formed by a reduction gear which connects the motor to toothed wheel 4. Finally, the electronic control circuit (not shown) is preferably a known type of microcontroller for a timepiece application. Again according to the invention, the capacitive detection device includes a rotor integral in rotation with the wheel set, a stator, and an electronic measuring circuit. In the present example, wheel 4 is a metal wheel which is electrically connected to earth. This feature allows wheel 4 and arbor 10 on which it is mounted to perform together the rotor function, i.e. the rotating part, for the capacitive detection device. It will therefore be understood that, in the present example, the same one wheel set simultaneously performs the rotating wheel set and rotor functions of the detection device.

FIG. 1 shows that the stator comprises two pairs of electrodes respectively referenced 18a, 18b and 20a, 20b. These electrodes are shown on a printed circuit board (PCB) 22 which is integral with the plate of movement 2. In the present example, each pair of electrodes (18a, 18b and 20a, 20b) is formed of two rectilinear conductive bands which are formed on PCB 22 parallel to each other. It can be seen that the two pairs of electrodes extend radially underneath the plate of wheel 4, and that they form between them an angle of approximately 60°. It is also possible to verify that in the embodiment illustrated the two pairs of electrodes are isometric to each other, i.e. of equal norm values for an identical rotor influence, and that they are also superposable by means of a rotation about axis 12. One advantage of this feature is that in the absence of disturbing effects, the mean values of capacitances C1 and C2 over one complete revolution of the rotor are equal, and in the absence of rotor influence on each of capacitances C1 and C2, the difference C1-C2 is zero. It can also be seen in FIG. 1 that the PCB carries a conductive path 24 which connects electrodes 18b and 20b to each other, and to a connection terminal 26c. Electrodes 18a and 20a are respectively connected to connection terminals 26a and 26b. As seen in FIG. 1, the two conductors forming the electrodes of each pair extend parallel to and at a short distance from each other. Due to the proximity between the two conductors, each pair of electrodes behaves like a capacitor with a certain capacitance (the capacitance of the first pair of electrodes 18a, 18b is designated C1 and the capacitance of the second pair of electrodes 28, 20b is designated C2). Referring simultaneously to FIGS. 1 and 2, it is also to be noted that the pairs of electrodes 18a, 18b, and 20a, 20b are arranged relative to plate 8 of wheel 4 such that the air-gap that separates the electrodes of each of the pairs is at least partially beneath opening 16 in at least one angular position of wheel 4. Further, the pairs of electrodes are preferably arranged such that the two electrodes of one pair are simultaneously at least partially beneath opening 16 in at least one position of wheel 4. It is also specified that the air-gap width of one of the pairs of electrodes is preferably approximately equal to the distance separating the height of PCB 22 from the toothed wheel plate 8.

According to the invention, the rotor of capacitive detection device 2 (in other words, wheel 4 and, additionally arbor 10 if it is also made of metal) is adapted such that first capacitance C1 and second capacitance C2 both depend on the angular position of the rotor. In the embodiment shown, it is the presence of opening 16 in plate 8 of wheel 4 which makes capacitances C1 and C2 sensitive to the angular position of the rotor. It will be understood that the capacitance of one pair of electrodes is maximum when opening 16 is located immediately above the pair of electrodes, since the charge transfer from one to the other is no longer facilitated by the presence of a conductor. It will be noted however that PCB 22 could, equally, be disposed above wheel 4. It will be understood that in that event, the capacitances would reach their maximum value when opening 16 is located immediately beneath an electrode pair.

Figure 3:
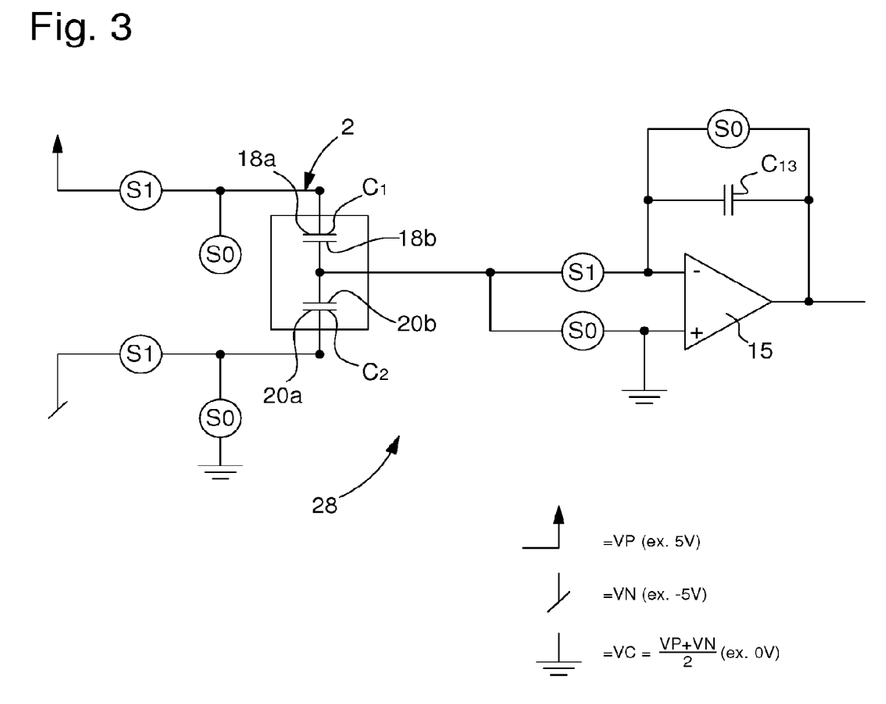
FIG. 3 is an electronic diagram of a particular embodiment of the electronic measuring circuit of the capacitive detection device of the electromechanical apparatus illustrated in FIGS. 1 and 2.

FIG. 3 is an electronic diagram of an electronic measuring circuit suitable for use in the capacitive detection device of FIGS. 1 and 2. The operating principle of the electronic circuit illustrated is to power electrodes 18a and 20a by means of connection terminals 26a, 26b, and to measure the amount of charge which, in response to powering, accumulates in electrodes 18b and 20b which are mutually connected to the common terminal 26c.

The electronic circuit which is designated generally by the reference 28 in FIG. 3 is arranged to have two distinct operating modes. These are an operating mode for resetting to zero (designated S0) and a measurement operating mode (designated S1). The change between the two operating modes is controlled by the electronic control circuit (not shown) which is arranged to send control signals to a certain number of switches represented by one of the indications S0 or S1 in FIG. 3. Indications S0 or S1 correspond to the operating mode in which the switches are closed. It is specified that the switches are preferably formed by transistors of an integrated circuit in which the electronic measuring circuit is implemented.

Referring again to FIG. 3, it is seen that in operating mode S0 all the electrodes 18a, 20a, 18b and 20b are earthed (VC). Further, the non-inverting input (+ input) of amplifier 15 is also connected to earth, whereas the output of amplifier 15 is short-circuited with its inverting input. In such conditions, the current and voltage are zero everywhere in the circuit. When the electronic circuit is then switched into operating mode S1, all the switches referenced S0 are open and the three switches referenced S1 are closed. In these conditions, electrodes 18a and 20a are powered and respectively placed at reference potentials VP and VN. The two coupled electrodes 18b, 20b are connected together to the inverting input of amplifier 15. It can also be seen in the Figure that there is no longer a short circuit between the output of amplifier 15 and its inverter input. The amplifier output is now connected to the inverter input by means of a capacitor referenced C13. It will be understood that, as a result of the powering of electrodes 18 and 20a, the coupled electrodes 18b and 20b will exchange charges. Further, in the case where the values of C1 and C2 are not equal, the electronic circuit will have to supply a residual charge to the coupled electrodes. This residual charge will be formed of negative charges in the case where capacitance C1 is greater than capacitance C2, and of positive charges in the case where capacitance C1 is smaller than capacitance C2. The voltage responsible for shifting charges to or from the two coupled electrodes 18b, 20b will also produce a difference in potential between the two inputs of amplifier 15. Amplifier 15 will thus transmit current for as long as this difference in potential remains. The amplifier will therefore charge capacitor C13 until the voltage between the two inputs of the amplifier is zero again. At that moment, voltage VM between the terminals of capacitor C13 will be determined by the following relation:

$$VM = \frac{C1 - C2}{C13}(VP - VC)$$

It will also be understood that the voltage between the terminals of capacitor C13 is equal to the amplitude of the signal at the output of amplifier 15. In other words, voltage VM corresponds to the value of the signal at the electronic measuring circuit output. It may also be noted that, in the case where the mean values of capacitances C1 and C2 over one complete revolution of the rotor are equal, the mean output signal value (VM) over one complete revolution is equal to zero.

Figure 4:
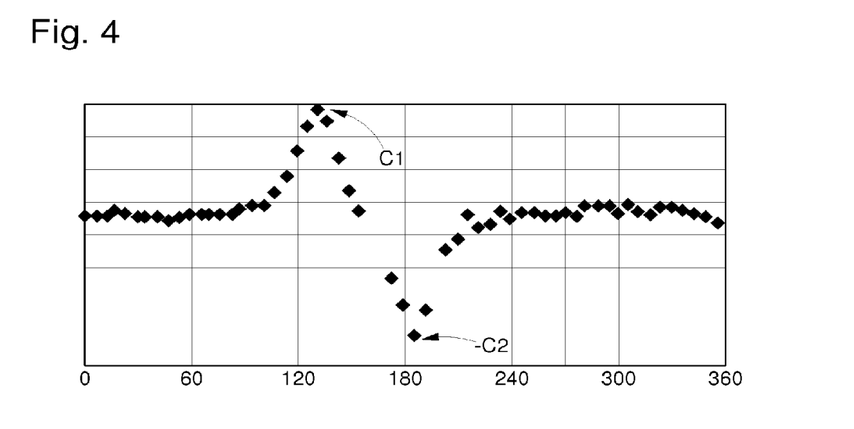
FIG. 4 is a graph showing by way of example different values that can be taken by the signal representative of the difference between the first and second capacitance, when the wheel set is driven by the stepping motor to make one complete revolution by successively occupying a plurality of angular positions all of which are equidistant from each other.

FIG. 4 is a graph showing by way of example the values taken by the signal at the output of amplifier 15 during 60 successive measurements spaced at 6° and corresponding to a 360° rotation of wheel 4. It was seen above that the capacitance of a given electrode pair is maximum when opening 16 is located immediately above the electrode pair. As can be verified in FIG. 4, this phenomenon is reflected in the general shape of the curve. Indeed, when opening 16 passes over electrodes 18a, 18b, capacitance C1 reaches a maximum resulting in a first positive peak of the curve. Then, when the opening passes over electrodes 20a, 20b a negative peak is observed due to the increase in capacitance C2. It will be noted that the shape of the curve may vary considerably from one embodiment to another. In particular, the shape of the two peaks depends on the shape and dimensions of opening 16. Moreover, the shape of the curve, between the two peaks in particular, depends to a great extent on the arrangement of the two pairs of electrodes 18a, 18b, 28, 20b on the PCB, which are preferably spaced here, in the preferred embodiment of FIG. 1, at 60°, namely the angular value between the maximum and minimum of the curve of FIG. 4. It can also be deduced from FIG. 4 that the reference angle "0" corresponds to the position of the hand in FIG. 1, at 9 o'clock using ordinary watch terminology relating to the position of the hands on a dial.

According to the invention, the electronic control means contain a stored table associating at least part of the mutually equidistant angular positions occupied in succession by the wheel set with as many signal reference values. The memory in which the pairs of values forming the table are stored is preferably a non-volatile memory. It will be understood that, owing to the use of a non-volatile memory, it is no longer necessary to recalibrate the angular position of the wheel set when the electric power supply is re-established after an interruption (due for example to battery replacement). In these conditions, the calibrated reference values are determined and stored in the table once and for all in the factory.

The simplest way to store a table associating each of the mutually equidistant angular positions occupied in succession by the wheel set with as many signal reference values is to start by simultaneously initialising the angular position of the wheel set and the circuit counting the control impulses of the stepping motor, and then to cause the wheel set to make one complete revolution. After each motor step during this complete revolution, the impulse counting circuit supplies the value of the new angular position of the wheel set, and the electronic measuring circuit simultaneously supplies the corresponding value of the differential signal Once stored in a correspondence table, the series of pairs of values obtained at each motor step form a particularly simple signal modelling. Unlike the actual signal values, the signal reference values may be considered to be repeated identically with each revolution of the wheel set. The series of signal reference values can thus advantageously correspond to a periodic function, the length of the period of the function being equal to the number of motor steps necessary to accomplish one complete revolution of the rotor. The stored correspondence table therefore does not need to contain more than one reference value for each distinct angular position of the rotor, and the correspondence table may advantageously have a loop structure reflecting the periodicity of the signal reference values. It will be understood that the periodicity of the reference values reflects the cyclical character of the succession of angular positions occupied by the rotor, and whose angular resolution corresponds to that defined by the stepping motor.

The function of the capacitive detection device of the electromechanical apparatus of the present invention is to allow detection of the angular position of the rotating wheel set (formed in the present example by the rotor, composed of toothed wheel 4 and arbor 10). According to the invention, in order to detect the position of the wheel set, the electronic control circuit implements a method consisting in a first step of controlling the stepping motor so as to cause the wheel set to make step-by-step one complete revolution, and to store the signal values provided by the electronic measuring circuit for at least one in two of said mutually equidistant angular positions of the wheel set.

During a second step, the electronic control circuit calculates the correlation between the succession of signal values stored during the first step, and the succession of reference values drawn from the table, then, utilising the periodicity of the stored reference signal, the electronic control circuit repeats the correlation calculation each time shifting one step further the starting point of the succession of reference values. The electronic control circuit makes the correlation calculation as many times as there are distinct angular positions able to form the starting point of a period of the function formed by the reference values.

During a third step, the electronic control circuit determines from among the correlations calculated during the second step, the correlation whose value is the highest and identifies the starting point of the reference signal period associated with this correlation. It will be understood that the starting point thus identified corresponds to the angular position of the wheel set. Indeed, the starting point from which the complete revolution is made during the first step must be the same as the starting point of the succession of reference values.

Figure 5:
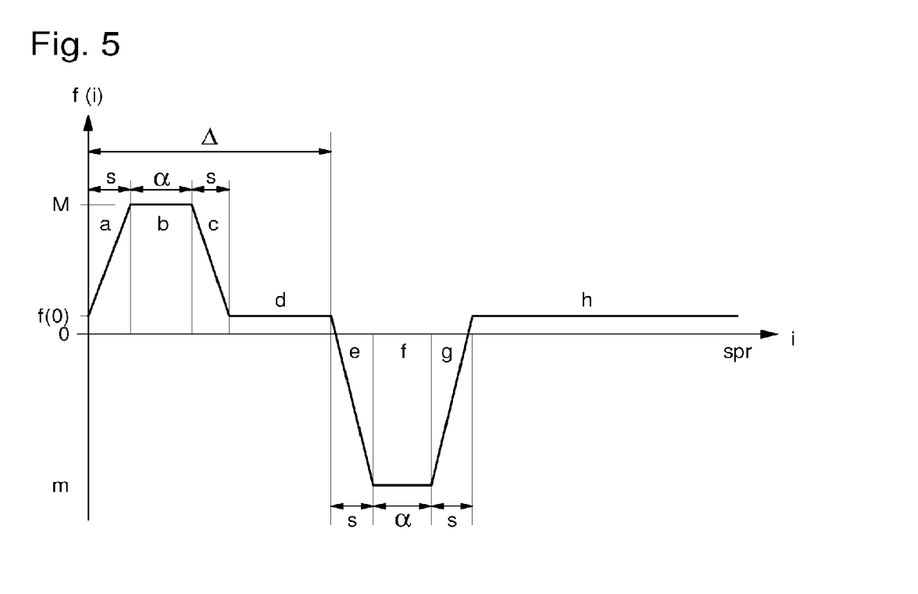
FIG. 5 is a graph of a piecewise linear function which corresponds to an exemplary variant of a parametric model.
Figure 6:
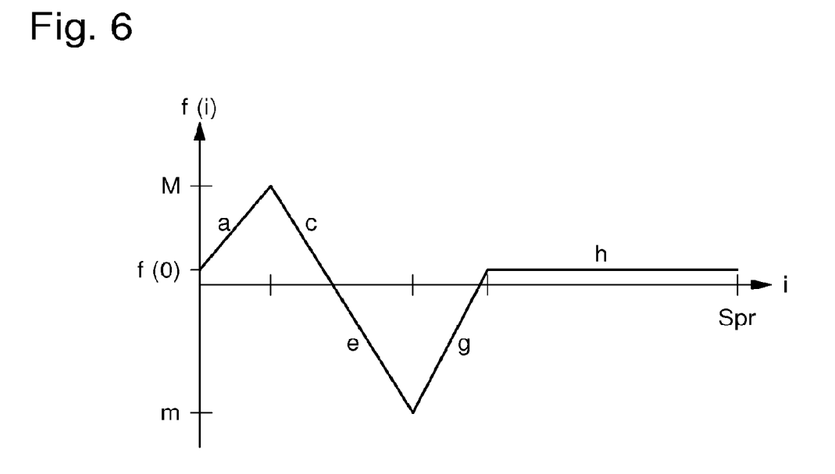
FIG. 6 is a graphic illustration of the parametric model of FIG. 5 after adjustment of all the parameters of the model to the values taken by the points on the empirical curve of FIG. 4.

A particularly simple manner of creating a correspondence table containing calibrated reference values of the signal at the electronic measuring circuit output was explained above. Referring now to FIGS. 5 and 6, there will be described a second possible manner of creating a correspondence table which contains reference values for the signal calibrated as a function of the angular position of wheel 4. FIG. 5 and table 1 below respectively show in the form of a graph and in the form of formulae a piecewise linear model representing the differential signal supplied by the electronic measuring circuit as a function of a number of steps "i" corresponding to a given angular position of the wheel set, whereas table 2 below explains the different parameters that are used to determine these reference values.

TABLE 1

| (a) $i \in [0, s]$ | $f(i) = \frac{M - f(0)}{s} i + f(0)$ |
|---|---|
| (b) $i \in [s, s + \alpha]$ | $f(i) = M$ |
| (c) $i \in [s + \alpha, 2s + \alpha]$ | $f(i) = \frac{M - f(0)}{s}(s + \alpha - i) + M$ |
| (d) $i \in [2s + \alpha, \Delta]$ | $f(i) = f(0)$ |
| (e) $i \in [\Delta, \Delta + s]$ | $f(i) = \frac{m - f(0)}{s}(i - \Delta) + f(0)$ |
| (f) $i \in [\Delta + s, \Delta + s + \alpha]$ | $f(i) = m$ |
| (g) $i \in [\Delta + x + \alpha, \Delta + 2s + \alpha]$ | $f(i) = \frac{m - f(0)}{s}(\Delta + s + \alpha - i) + m$ |
| (h) $i \in [\Delta + 2s + \alpha, spr]$ | $f(i) = f(0)$ |

TABLE 2

M: = maximum value of the signal amplitude;
m: = minimum value of the signal amplitude;
spr: number of steps per revolution = number of measured values;
moy: = mean value of the signal amplitude measurements;
$\alpha$: = width of the possible flat part that intersects the tip of the triangle (in no. of steps);
s: = horizontal distance between the base and the flat part of the triangle (in no. of steps);
f(0): = theoretical amplitude of the signal far from the opening (this value is defined so that the mean of the theoretical output signal values is also equal to the mean of the measured values).

As shown by the formulae of Table 1, the model of the present example is a parametric model whose various parameters M, m, moy, $\alpha$, $\Delta$, s must be adjusted (fitted) so that the reference values provided by the model best approximate the typical values of an empirical curve. As shown in FIG. 5, which shows the amplitude of the signal f(i) as a function of the number of steps "i", the model forming the subject of the present example is formed by a sequence of rectilinear segments. The main advantage of using a piecewise linear model is that the linear feature simplifies the calculations required to set the parameters.

As can also be seen in FIG. 5, the model includes four quite distinct regions. A first region including segments a, b, and c corresponds to a positive peak associated with the passage of opening 16 over the pair of electrodes 18a, 18b. A second region formed by a horizontal segment d corresponds to the passage of the opening over the area of plate 8 which extends between the two pairs of electrodes. A third region including segments, e, f and g corresponds to a negative peak associated with the passage of the opening over the pair of electrodes 20a, 20b and finally a fourth region formed by a long horizontal segment h corresponds to the passage of opening 16 of wheel 4 over the side of the portion of the PCB devoid of electrodes. It will be understood that the values taken by the various parameters of the model determine the shape and the height of the peaks, the extent of the gaps between the peaks, the mean theoretical value, etcetera.

The various parameters of the model may be set for example by means of a multiple regression calculation. Since the model of the present example is linear, the regression calculation may consist of a simple multi-linear regression. The regression calculation can determine the values of the parameters for which the vertical deviation (on the ordinate) between an empirical curve provided by the capacitive detection device and the reference curve derived from the parametric model is minimal.

According to the present example, once adjusted to the empirical curve of FIG. 4, the parametric model takes the form of the reference curve shown in FIG. 6, which similarly shows the signal amplitude f(i) as a function of the number of steps "i". By comparing the curve of FIG. 6 to that of FIG. 5, it is clear, in particular, that adjustment of the model has resulted in this specific case in parameter $\alpha=0$ and parameter $\Delta=2$ s. Once all the parameters are adjusted, the electronic control circuit stores the reference curve values obtained in the memory in the form of a table associating the various angular positions of the wheel set with the corresponding reference value.

Naturally, there are other possible ways of modelling the differential signal supplied by the electronic measuring circuit as a function of the angular positions of the wheel set. A simplified model is defined by the following equation: for $1 \leq i \leq spr$ $$f(i) = \begin{cases} -1 & \text{if } s1 - \text{Width1} \leq i \leq s1 + \text{Width1}, \\ -1 & \text{if } s2 - \text{Width2} \leq i \leq s2 + \text{Width2}, \\ 0 & \text{otherwise} \end{cases}$$

$$1 \leq i \leq spr$$

where s1 and s2 are integer numbers, s1 being a theoretical maximum position of the measured signal, s2 being a theoretical minimum position of said signal, and where Width1 and Width2 are two predefined positive parameters such that 2*Width1 is a theoretical peak width corresponding to the maximum of the measured signal, and 2*Width2 is a theoretical trough width corresponding to the minimum of the measured signal.

Another way of making a correspondence table containing calibrated reference values for the electronic measuring circuit output signal consists in creating a reference curve in the following manner. First of all, the wheel set makes N complete revolutions by means of the stepping motor, measuring one sample per step. X number of samples can thus be obtained. A discrete Fourier transform is then applied to said X samples, generating a frequency spectrum. Then, an inverse discrete Fourier transform is applied to the harmonics of said frequency spectrum, and only to the harmonics, which produces a second curve comprising samples corresponding to the N revolutions of the wheel set. The reference curve is thus formed of samples corresponding to the first of said N revolutions of the second curve. Alternatively, the reference curve is formed of samples averaged over the N revolutions of the second curve.

It is to be noted that most of the algorithms for the calculation of a correlation are capable of providing a result even when part of the data is missing from the set of values to be correlated. Hence, even if the initial calibration operation does not provide reference values for all the possible angular positions, the correlation operation can still be performed subsequently and effectively determine the angular position of the wheel set. The advantage of using a parametric model to determine the reference values is nonetheless precisely that any missing values are extrapolated by linear approximation. It is then possible to extract a predetermined sub-set of reference values to perform the correlation calculation, for example half, taking account of the polarity of the rotor, as explained below, to increase the speed of calculation.

There will now be described a second embodiment of the invention with reference to FIGS. 7A, 7B and 7C. The second embodiment differs from the first essentially in the shape and the dimensions of the schematic opening 16 made in the schematic wheel 104 of the rotor. As shown in FIG. 7B, schematic opening 116 has the shape of a ring sector referenced Alpha_hole whose opening is approximately equal to one third of a revolution (120°). The stator of the second embodiment of the capacitive detection device is entirely similar to that described in relation to the first embodiment. It can be seen, in particular in FIG. 7A, that the two pairs of schematic electrodes 118*a*, 118*b*, 120*a*, 120*b* are dimensioned to be capable of passing directly opposite schematic opening 116, and that they form between them an angle referenced Alpha_elec of always approximately 60°.

As the ring sector which delimits the opening made in the rotor extends over a considerably greater angle than the angle separating the two pairs of electrodes—two times greater in the illustrated example—schematic opening 116 may be simultaneously opposite both pairs of electrodes (cf FIG. 7C), which is never the case in the preferred embodiment of FIG. 1 where the angular sector covered by the opening is much smaller than the angular deviation between the electrodes. It will thus be understood from the foregoing that, according to the invention, the angle defining the width of the opening in the rotor may be much greater as well as much smaller than the angle that separates the two pairs of electrodes. It's will be specified however that even if the opening is smaller than the distance between the two pairs of electrodes, the opening is always at least as large as the distance separating the two electrodes of the same pair, embodied by the reference D in FIG. 7A, so that a marked peak is always present for the maximum value of each capacitance C1 and C2. Further, it may be noted that this inter-electrode distance D_Elec, which may be quite finely adjusted by laser setting, must preferably be configured to be systematically greater than or equal to the endshake between the PCB and the rotor wheel, so that the influence of the opening made in the rotor is as great as possible with respect to the measured capacitances.

Figure 7A:
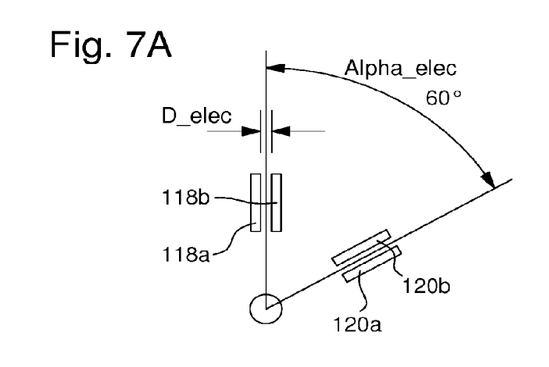
FIG. 7A is a schematic diagram of a stator of a capacitive detection device according to a second embodiment of the invention.
Figure 7B:
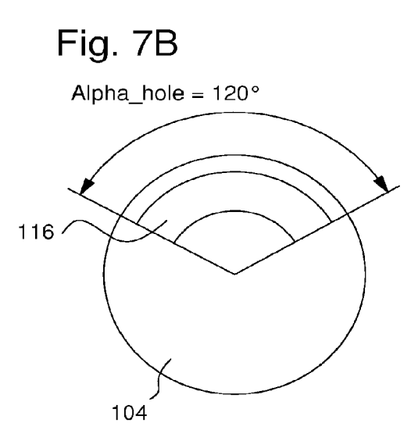
FIG. 7B is a schematic diagram of the rotor of the capacitive detection device whose stator is shown in FIG. 7A.
Figure 7C:
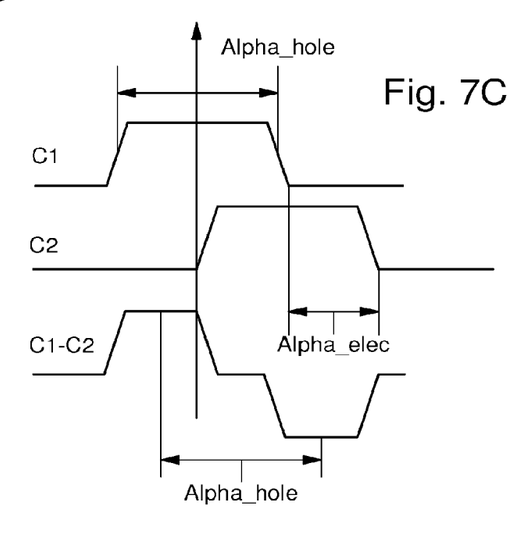
FIG. 7C contains 3 graphs used to construct a curve of reference values for the capacitive detection device of FIGS. 7A and 7B.

The advantage of the embodiment illustrated by FIGS. 7A, 7B and 7C is that it provides a weight gain of close to 30% of the rotor wheel, which is advantageous in terms of inertia and thus allows easier implementation of the stepping motor, thereby providing energy savings. In this case, for example, one could also increase at the same time the size—and consequently the volume—of a hand, disposed in the middle of the sector Alpha_hole for reasons of symmetry, without harming an unbalance of the rotating system, and while improving the readability of the display.

In light of the various embodiments described, it will be understood that various types of openings are possible, not limited to slots. Recesses of the "cake slice" shape, extending as far as the centre of the wheel set may also be envisaged, further reducing the mass and therefore the inertia of the rotor.

According to an advantageous embodiment of the invention, the stepping motor is a bipolar motor which is arranged to be powered by control impulses whose polarity must be inverted at each step in order to operate the motor in a determined direction. Such bipolar motors are known to those skilled in the art. EP Patent No 0341582 in particular describes one such bipolar motor, which is arranged to be able to turn step-by-step in both directions, and which must alternately receive control impulses polarized in one direction and then in the other to maintain a given direction of rotation. It will therefore be understood that when such a motor causes wheel 4 to make step-by-step one complete revolution, the successive steps may be distributed into two categories. The first category is formed of odd steps (the 1st step, the 3rd step, the 5th step, etc.), and the second category is formed of even steps (the 2nd step, the 4th step, etc.). The odd steps are produced by a control impulse polarized in a first direction and the even steps are produced by a control impulse polarized in the other direction.

The aforementioned possibility of differentiating between the even motor steps and the odd motor steps is advantageous when the determined integer number of motor steps necessary to cause wheel 4 to make exactly one revolution is an even number. Indeed, in that case, it is possible to distinguish, among the angular positions occupied in succession by wheel 4, one half of angular positions reached following an even motor step and another half of angular positions reached following an odd motor step. According to an advantageous variant, the correspondence table which is stored in the electronic control circuit contains, in addition to reference values for the signal as a function of the angular position of the rotor, an indication of parity (odd or even) for each angular position of the rotor according to whether an even motor step or an odd motor step is required to reach the angular position in question. As a result of the features of the correspondence table that have just been described, it is possible to simplify the position detection method. Indeed, it will be understood that the number of correlations to be calculated can be divided by 2.

It will also be clear that various alterations and/or improvements evident to those skilled in the art may be made to the embodiment forming the subject of the present description without departing from the scope of the present invention defined by the annexed claims.

What is claimed is:

1. An electromechanical apparatus comprising a wheel set and an analogue indicator member which are integral in rotation, a stepping motor, an electronic control circuit arranged to control the stepping motor, a drive train connecting the stepping motor to the wheel set and to the analogue indicator member, and a capacitive detection device, the drive train having a ratio such that the stepping motor causes the wheel set to make exactly one complete revolution in a determined integer number of motor steps, so that the motor steps subdivide one complete revolution of the wheel set into said integer number of mutually equidistant angular positions, and the capacitive detection device comprising a rotor integral in rotation with the wheel set, a stator and an electronic measuring circuit, the stator comprising a first pair of electrodes having a first capacitance, the rotor being adapted such that the value of the first capacitance depends on the angular position of said rotor, and the electronic measuring circuit being arranged to generate and to provide to the electronic control circuit a signal dependent on the value of the first capacitance;
wherein the stator includes a second pair of electrodes having a second capacitance, the value of the second capacitance depending on the angular position of said rotor, wherein the pairs of electrodes and the electronic measuring circuit are configured such that the signal is representative of a difference between the respective values of the first and of the second capacitance, and wherein the electronic control means contain a stored correspondence table which contains reference values for the signal as a function of the angular position of the rotor for said mutually equidistant angular positions of the wheel set.

2. The electromechanical apparatus according to claim 1, wherein the electronic control circuit includes a circuit for counting the control impulses of the stepping motor, in order to count the steps made by the stepping motor.

3. The electromechanical apparatus according to claim 2, wherein the stepping motor is a bipolar motor arranged to be powered by current impulses whose flow direction must be inverted at each step in order to operate the motor in a determined direction, and wherein the correspondence table which is stored in the electronic control circuit contains, in addition to the reference values for the signal as a function of the angular position of said rotor, an indication of parity (even or odd) for each angular position of said rotor, depending on whether an even motor step or an odd motor step is required to reach the angular position in question.

4. The electromechanical apparatus according to claim 1, wherein the rotor of the capacitive detection device comprises a wheel made of a conductive material and whose plate is pierced with an opening of determined shape and dimensions, the capacitive detection device being arranged so that one electrode of the first pair and one electrode of the second pair are at least partially opposite said opening respectively in a first and a second angular position of said rotor.

5. The electromechanical apparatus according to claim 1, wherein the electrodes of the first and of the second pair extend in the same plane perpendicular to the axis of said rotor.

6. The electromechanical apparatus according to claim 5, wherein the two pairs of electrodes are isometric to each other, and superposable by rotating one of the two pairs about the axis.

7. The electromechanical apparatus according to claim 1, wherein the stator of the capacitive detection device comprises a conductor that connects one of the electrodes of the first pair to one of the electrodes of the second pair.

8. The electromechanical apparatus according to claim 1, wherein the analogue indicator member is a hand.

9. The electromechanical apparatus according to claim 4, wherein the analogue indicator member is a hand, the hand is integral with the rotor, the hand pointing in the direction of the centre of the opening so that the unbalance caused by the presence of the opening can at least partially compensate for the torque caused by the weight of the hand.

10. The electromechanical apparatus according to claim 9, wherein the reference values for the signal define a function of the angular position of said rotor, the function being a piecewise linear function.

11. The electromechanical apparatus according to claim 1, wherein the correspondence table which contains the reference values for the signal as a function of the angular position of said rotor is stored in a non-volatile memory of the electronic control circuit.

12. A method for determination of the angular position of a wheel set integral in rotation with an analogue indicator of an electromechanical apparatus according to claim 1, the method including the steps of:
I. controlling the stepping motor so as to cause a rotor integral with said wheel set to make one complete step-by-step revolution, and to store signal values provided by the electronic measuring circuit for at least one in two of said mutually equidistant angular positions of said wheel set;
II. drawing, from the stored table matching at least one part of the integer number of mutually equidistant angular positions of the wheel set to as many reference values of the signal, a plurality of sequences of reference values respectively corresponding to the various possible circular permutations of said at least one in two angular positions of said mutually equidistant angular positions, and calculating a correlation between the succession of stored values of the signal provided and each of the sequences of reference values;

III. determining the angular position of said analogue indicator by identifying among the correlations calculated for the various sequences of reference values, the correlation whose value is maximum.

13. The method for determination of the angular position of a wheel set according to claim 12, wherein in step (I), the values of the signal provided by the electronic measuring circuit are stored for all said mutually equidistant angular positions of the wheel set, and wherein, in step (II), the number of reference value sequences is equal to said determined number, the sequences respectively corresponding to the various circular permutations of all said equidistant angular positions.

14. The method for determination of the angular position of a wheel set according to claim 12, wherein the stepping motor of the electromechanical apparatus is a bipolar motor arranged to be powered by current impulses whose direction of flow must be inverted at each step in order to operate the motor in a determined direction, the method wherein said determined number is an even number, wherein in step (I), the values of the signal provided by the electronic measuring circuit are stored for one in two of the mutually equidistant angular positions of the wheel set, and wherein, in step (II), the number of reference value sequences is equal to half of said determined number, the sequences respectively corresponding to the various circular permutations of said one in two of the mutually equidistant angular positions.

15. The method for determination of the position of a wheel set according to claim 12, comprising a preliminary step of creating a correspondence table, said creation step including a generation of a theoretical curve and an adjustment of the parameters of said theoretical curve over an empirical curve provided by the capacitive detection device.

16. The method for determination of the position of a wheel set according to claim 15, wherein the generation of the theoretical curve includes one complete step-by-step revolution of the wheel set, and a storage of values of a signal supplied by the electronic measuring circuit in response to the revolution.

17. The method for determination of the position of a wheel set according to claim 16, wherein the generation of the theoretical curve includes the determination of a maximum of said values supplied by the electronic measuring circuit, the theoretical curve including in succession a rising edge to said maximum, a flat part, then a descending edge.

18. The method for determination of the position of a wheel set according to claim 16, wherein the generation of the theoretical curve includes the determination of a first step corresponding to a maximum of the values supplied by the electronic measuring circuit and of a second step corresponding to a minimum of said values, the theoretical curve including a first positive flat part centred on the first step, and a second negative plateau centred on the second step.

19. The method for determination of the position of a wheel step according to claim 16, comprising a Fourier transform of the values supplied by the electronic measuring circuit so as to obtain a frequency spectrum, then an inverse transformation of the harmonics of said spectrum.

* * * * *